United States Patent
Oikawa et al.

(10) Patent No.: US 12,284,811 B2
(45) Date of Patent: Apr. 22, 2025

(54) MAGNETIC MEMORY DEVICE

(71) Applicants: Kioxia Corporation, Tokyo (JP); SK hynix Inc., Icheon-si (KR)

(72) Inventors: Tadaaki Oikawa, Seoul (KR); Youngmin Eeh, Seongnam-si (KR); Eiji Kitagawa, Seoul (KR); Taiga Isoda, Seoul (KR); Ku Youl Jung, Icheon-si (KR); Jin Won Jung, Icheon-si (KR)

(73) Assignees: Kioxia Corporation, Tokyo (JP); SK HYNIX INC., Gyeonggi-Do (KR)

( * ) Notice: Subject to any disclaimer, the term of this patent is extended or adjusted under 35 U.S.C. 154(b) by 615 days.

(21) Appl. No.: 17/472,472

(22) Filed: Sep. 10, 2021

(65) Prior Publication Data
US 2022/0302205 A1    Sep. 22, 2022

(30) Foreign Application Priority Data
Mar. 17, 2021    (JP) ................. 2021-043141

(51) Int. Cl.
*H10B 61/00* (2023.01)
*H10N 50/10* (2023.01)
*H10N 50/80* (2023.01)
*H10N 50/85* (2023.01)

(52) U.S. Cl.
CPC ............ *H10B 61/00* (2023.02); *H10N 50/10* (2023.02); *H10N 50/80* (2023.02); *H10N 50/85* (2023.02)

(58) Field of Classification Search
None
See application file for complete search history.

(56) References Cited

U.S. PATENT DOCUMENTS

| | | | |
|---|---|---|---|
| 8,995,181 B2 | 3/2015 | Watanabe et al. |
| 9,130,143 B2 | 9/2015 | Nagase et al. |
| 9,142,756 B2 | 9/2015 | Nagamine et al. |
| 9,178,137 B2 | 11/2015 | Eeh et al. |

(Continued)

FOREIGN PATENT DOCUMENTS

| | | |
|---|---|---|
| JP | 2019012810 A | 1/2019 |
| JP | 2020035976 A | 3/2020 |

(Continued)

OTHER PUBLICATIONS

U.S. Appl. No. 17/199,593; First Named Inventor: Kenichi Yoshino; Title: "Magnetic Memory Device and Method for Manufacturing the Same"; filed Mar. 12, 2021.

(Continued)

*Primary Examiner* — Jack S Chen
(74) *Attorney, Agent, or Firm* — Holtz, Holtz & Volek PC

(57) ABSTRACT

According to one embodiment, a magnetic memory device includes a stacked structure including a first magnetic layer having a fixed magnetization direction, a second magnetic layer having a variable magnetization direction, a non-magnetic layer provided between the first magnetic layer and the second magnetic layer, a molybdenum (Mo) layer provided on an opposite side of the non-magnetic layer with respect to the second magnetic layer, and an oxide layer provided between the second magnetic layer and the molybdenum (Mo) layer and containing a predetermined element selected from a rare earth element, silicon (Si) and aluminum (Al).

7 Claims, 3 Drawing Sheets

(56) References Cited

U.S. PATENT DOCUMENTS

| | | |
|---|---|---|
| 9,184,374 B2 | 11/2015 | Sawada et al. |
| 9,209,386 B2 | 12/2015 | Nagamine et al. |
| 9,252,357 B2 | 2/2016 | Watanabe et al. |
| 9,269,890 B2 | 2/2016 | Nakayama et al. |
| 9,293,695 B2 | 3/2016 | Ueda et al. |
| 9,461,240 B2 | 10/2016 | Sawada et al. |
| 9,466,350 B2 | 10/2016 | Murayama et al. |
| 9,608,199 B1 | 3/2017 | Kitagawa |
| 9,620,561 B2 | 4/2017 | Nagase et al. |
| 9,640,584 B2 | 5/2017 | Nagamine et al. |
| 9,647,203 B2 | 5/2017 | Kitagawa et al. |
| 9,705,076 B2 | 7/2017 | Nagamine et al. |
| 9,741,928 B2 | 8/2017 | Ueda et al. |
| 9,947,862 B2 | 4/2018 | Watanabe et al. |
| 9,991,313 B2 | 6/2018 | Watanabe et al. |
| 10,026,888 B2 | 7/2018 | Ochiai et al. |
| 10,026,891 B2 | 7/2018 | Nagase et al. |
| 10,090,459 B2 | 10/2018 | Watanabe et al. |
| 10,103,318 B2 | 10/2018 | Watanabe et al. |
| 10,170,519 B2 | 1/2019 | Eeh et al. |
| 10,199,568 B2 | 2/2019 | Nagamine et al. |
| 10,211,256 B2 | 2/2019 | Kitagawa |
| 10,263,178 B2 | 4/2019 | Sawada et al. |
| 10,305,027 B2 | 5/2019 | Kato et al. |
| 10,388,343 B2 | 8/2019 | Oikawa et al. |
| 10,453,598 B2 | 10/2019 | Nubushi et al. |
| 10,468,170 B2 | 11/2019 | Eeh et al. |
| 10,510,950 B2 | 12/2019 | Watanabe et al. |
| 10,840,434 B2 | 11/2020 | Kitagawa et al. |
| 10,873,021 B2 | 12/2020 | Eeh et al. |
| 11,127,445 B2 | 9/2021 | Eeh et al. |
| 2014/0284534 A1 | 9/2014 | Nagase et al. |
| 2014/0284733 A1 | 9/2014 | Watanabe et al. |
| 2015/0068887 A1 | 3/2015 | Nagamine et al. |
| 2015/0069544 A1 | 3/2015 | Nagamine et al. |
| 2015/0069554 A1 | 3/2015 | Nakayama et al. |
| 2015/0259788 A1 | 9/2015 | Nagamine et al. |
| 2016/0099408 A1 | 4/2016 | Nagamine et al. |
| 2016/0130693 A1 | 5/2016 | Sawada et al. |
| 2016/0260773 A1 | 9/2016 | Kitagawa et al. |
| 2016/0268501 A1 | 9/2016 | Kitagawa |
| 2016/0380182 A1 | 12/2016 | Watanabe et al. |
| 2017/0263678 A1 | 9/2017 | Kitagawa |
| 2017/0263679 A1 | 9/2017 | Ozeki et al. |
| 2017/0263680 A1 | 9/2017 | Yoshino et al. |
| 2018/0076262 A1 | 3/2018 | Eeh et al. |
| 2018/0205006 A1 | 7/2018 | Watanabe et al. |
| 2018/0269043 A1 | 9/2018 | Ueda et al. |
| 2018/0277745 A1 | 9/2018 | Oikawa et al. |
| 2018/0309048 A1 | 10/2018 | Ochiai et al. |
| 2019/0019841 A1 | 1/2019 | Eeh et al. |
| 2020/0075671 A1 | 3/2020 | Ozeki et al. |
| 2020/0075841 A1 | 3/2020 | Watanabe et al. |
| 2020/0294567 A1 | 9/2020 | Oikawa et al. |
| 2020/0302987 A1 | 9/2020 | Sawada et al. |
| 2021/0074908 A1 | 3/2021 | Oikawa et al. |
| 2021/0074911 A1 | 3/2021 | Isoda et al. |
| 2021/0083170 A1* | 3/2021 | Sawada ............... G11C 11/1659 |
| 2021/0287728 A1 | 9/2021 | Isoda et al. |
| 2021/0287755 A1 | 9/2021 | Aikawa et al. |
| 2021/0288240 A1 | 9/2021 | Sawada et al. |
| 2022/0085279 A1 | 3/2022 | Sawada et al. |
| 2022/0093848 A1 | 3/2022 | Kitagawa et al. |

FOREIGN PATENT DOCUMENTS

| | | |
|---|---|---|
| JP | 2020155442 A | 9/2020 |
| JP | 2022049878 | 3/2022 |
| JP | 2022051178 | 3/2022 |
| TW | 201535810 A | 9/2015 |
| TW | 202036560 A | 10/2020 |

OTHER PUBLICATIONS

U.S. Appl. No. 17/389,399; First Named Inventor: Taiga Isoda; Title: "Magnetoresistance Memory Device"; filed Jul. 30, 2021.

U.S. Appl. No. 17/471,340; First Named Inventor: Kazuya Sawada; Title: "Magnetic Memory Device"; filed Sep. 10, 2021.

U.S. Appl. No. 17/472,056; First Named Inventor: Tadaaki Oikawa; Title: "Magnetic Memory Device"; filed Sep. 10, 2021.

U.S. Appl. No. 17/472,131; First Named Inventor: Eiji Kitagawa; Title: "Magnetic Memory Device"; filed Sep. 10, 2021.

* cited by examiner

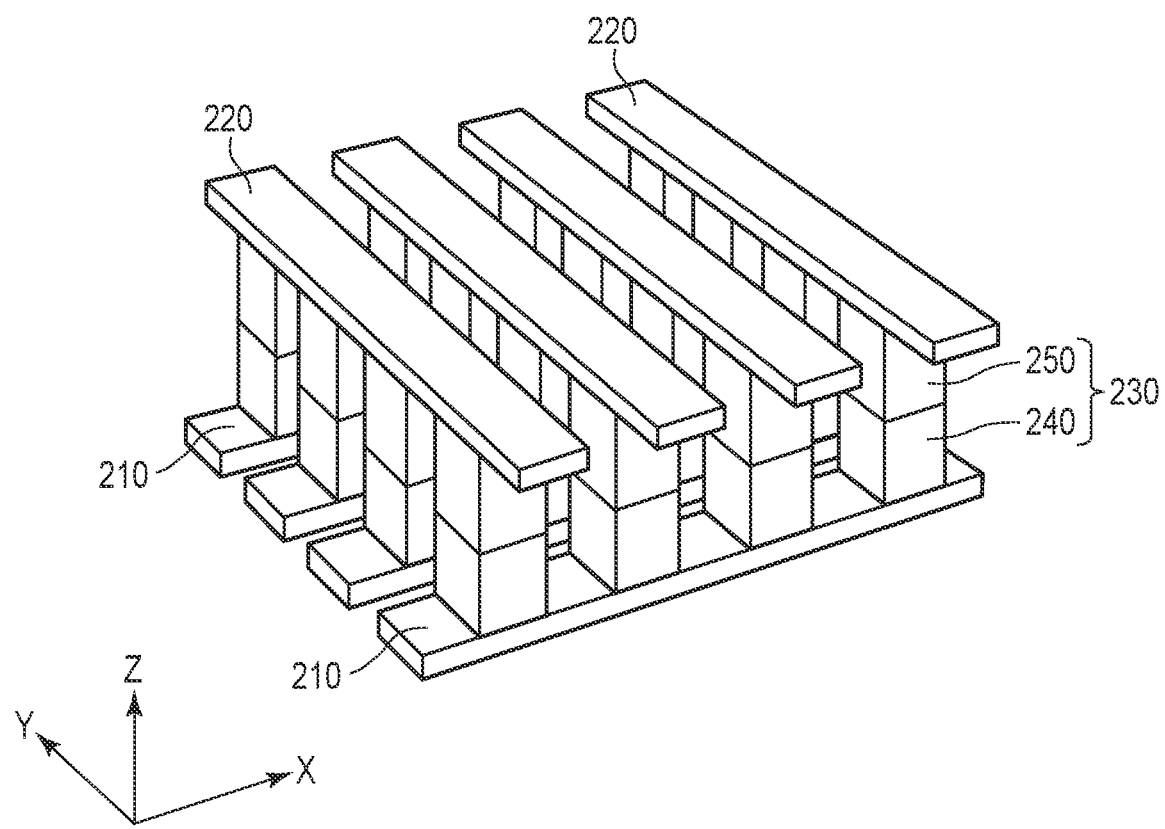
F I G. 3

MAGNETIC MEMORY DEVICE

CROSS-REFERENCE TO RELATED APPLICATIONS

This application is based upon and claims the benefit of priority from Japanese Patent Application No. 2021-043141, filed Mar. 17, 2021, the entire contents of which are incorporated herein by reference.

FIELD

Embodiments described herein relate generally to a magnetic memory device.

BACKGROUND

A magnetic memory device in which a plurality of nonvolatile magnetoresistance effect elements are integrated on a semiconductor substrate, has been proposed.

BRIEF DESCRIPTION OF THE DRAWINGS

FIG. 3 is a perspective view schematically showing a configuration of a magnetic memory device to which the magnetoresistance effect elements shown in the first and second embodiments are applied.

DETAILED DESCRIPTION

In general, according to one embodiment, a magnetic memory device includes a stacked structure including: a first magnetic layer having a fixed magnetization direction; a second magnetic layer having a variable magnetization direction; a non-magnetic layer provided between the first magnetic layer and the second magnetic layer; a molybdenum (Mo) layer provided on an opposite side of the non-magnetic layer with respect to the second magnetic layer; and an oxide layer provided between the second magnetic layer and the molybdenum (Mo) layer and containing a predetermined element selected from a rare earth element, silicon (Si) and aluminum (Al).

Embodiments will be described hereinafter with reference to the accompanying drawings.

Embodiment 1

Figure 1:
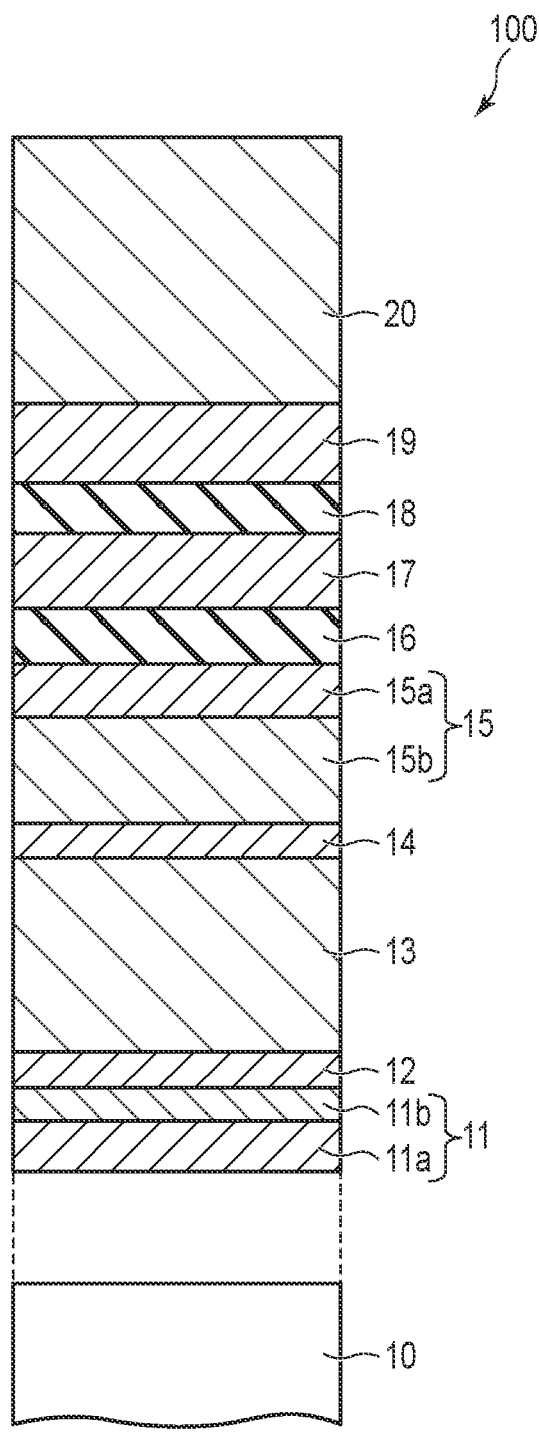
FIG. 1 is a cross-sectional view schematically showing a configuration of a stacked structure of a magnetoresistance effect element contained in a magnetic memory device according to the first embodiment.

FIG. 1 is a cross-sectional view schematically showing the configuration of a stacked structure of a magnetoresistance effect element contained in a magnetic memory device according to the first embodiment. As the magnetoresistance effect element, a magnetic tunnel junction (MTJ) element is used.

A stacked structure 100 is provided above the semiconductor substrate 10. The stacked structure 100 has a stacked structure in which stacked are in order from a lower layer side (a semiconductor substrate 10 side) to an upper layer side, a buffer layer 11, a silicon boron (SiB) layer 12, a shift-canceling layer (a third magnetic layer) 13, a spacer layer 14, a reference layer (a first magnetic layer) 15, a tunnel barrier layer (a non-magnetic layer) 16, a storage layer (a second magnetic layer) 17, an oxide layer 18, a molybdenum (Mo) layer 19 and an upper cap layer 20.

More specifically, the stacked structure 100 includes a reference layer 15, a storage layer 17, a tunnel barrier layer 16 provided between the reference layer 15 and the storage layer 17, a molybdenum (Mo) layer 19 provided on the opposite side of the tunnel barrier layer 16 with respect to the storage layer 17, an oxide layer 18 provided between the storage layer 17 and the molybdenum (Mo) layer 19, a shift-canceling layer 13 provided on the opposite side of the tunnel barrier layer 16 with respect to the reference layer 15, a buffer layer 11 provided on the opposite side of the reference layer 15 with respect to the shift-canceling layer 13, a silicon boron (SiB) layer 12 provided between the shift-canceling layer 13 and the buffer layer 11, a spacer layer 14 provided between the reference layer 15 and the shift-canceling layer 13, and an upper cap layer 20 provided on the opposite side of the oxide layer 18 with respect to the molybdenum (Mo) layer 19.

The reference layer (the first magnetic layer) 15 is provided on the shift-canceling layer 13 and is a ferromagnetic layer having a fixed magnetization direction. The fixed magnetization direction means that the magnetization direction does not vary according to a predetermined write current. The reference layer 15 includes a first layer portion 15a and a second layer portion 15b, with the first layer portion 15a being provided on the second layer portion 15b. The first layer portion 15a is formed of an FeCoB layer containing iron (Fe), cobalt (Co) and boron (B). The second layer portion 15b contains cobalt (Co) and at least one element selected from platinum (Pt), nickel (Ni) and palladium (Pd).

The tunnel barrier layer (the non-magnetic layer) 16 is an insulating layer provided on the reference layer 15. The tunnel barrier layer 16 is formed of an MgO layer containing magnesium (Mg) and oxygen (O).

The storage layer (the second magnetic layer) 17 is provided on the tunnel barrier layer 16 and is a ferromagnetic layer having a variable magnetization direction. The variable magnetization direction means that the magnetization direction varies according to a predetermined write current. The storage layer 17 is formed of an FeCoB layer containing iron (Fe), cobalt (Co) and boron (B).

The shift-canceling layer (the third magnetic layer) 13 is provided on the buffer layer 11 via the silicon boron (SiB) layer 12. The shift-canceling layer 13 is a ferroelectric layer having a fixed magnetization direction that is antiparallel to the magnetization direction of the reference layer 15, and has the function of canceling the magnetic field applied from the reference layer 15 to the storage layer 17. The shift-canceling layer 13 contains cobalt (Co) and at least one element selected from platinum (Pt), nickel (Ni) and palladium (Pd).

In this embodiment, the shift-canceling layer 13 has a superlattice structure in which Co layers and Pt layers are alternately stacked one on another. The shift-canceling layer 13 has a face centered cubic (FCC) crystal structure or a hexagonal close-packed (HCP) crystal structure. In the case of the FCC crystal structure, the shift-canceling layer 13 has a (111) plane along a direction perpendicular to the stacking direction of the stacked structure 100. In the case of the HCP crystal structure, the shift-canceling layer 13 has a (0001) plane in a direction perpendicular to the stacking direction of the stacked structure 100.

The spacer layer 14 is provided between the reference layer 15 and the shift-canceling layer 13, and the reference layer 15 and the shift-canceling layer 13 are antiferromagnetically coupled by the spacer layer 14. In other words, the reference layer 15, the shift-canceling layer 13 and the spacer layer 14 form a synthetic anti-ferromagnetic (SAF) structure. The spacer layer 14 is formed from a ruthenium (Ru) layer or an iridium (Ir) layer.

The silicon boron (SiB) layer 12 is a layer containing silicon (Si) and boron (B) and is provided below the shift-canceling layer 13. With the SiB layer 12 thus provided, it is possible to improve the perpendicular magnetic anisotropy and the like, of the shift cancellation layer 13. Further, with use of the SiB layer 12, thermal diffusion can be suppressed, thus making is possible to obtain a magnetoresistance effect element with excellent heat resistance. In the example shown in FIG. 1, the SiB layer 12 is provided on a lower surface of the shift-canceling layer 13, but the SiB layer 12 may be provided on an upper surface of the shift-canceling layer 13, or the SiB layer 12 may be provided within the layer of the shift-canceling layer 13.

The buffer layer 11 is provided below the SiB layer 12 and the shift-canceling layer 13. In other words, the SiB layer 12 and the shift-canceling layer 13 are provided on the buffer layer 11. The buffer layer 11 includes a first layer portion 11a and a second layer portion 11b provided on the first layer portion 11a.

The first layer portion 11a has an amorphous structure and is formed of hafnium (Hf) or hafnium boron (HfB).

The second layer portion 11b is formed of at least one element selected from molybdenum (Mo), tungsten (W) and tantalum (Ta). In other words, the second layer portion 11b may be a molybdenum (Mo) layer, a tungsten (W) layer, or tantalum (Ta) layer. The second layer portion 11b may also be an alloy layer of two or more elements selected from molybdenum (Mo), tungsten (W), and tantalum (Ta). The second layer portion 11b has a body centered cubic (BCC) crystal structure and has a (110) plane of the BCC crystal structure in a direction perpendicular to the stacking direction of the stacked structure 100. With use of such a second layer portion 11b, the shift-canceling layer 13 can be well oriented with respect to the FCC (111) plane or the HCP (0001) plane, and thus the perpendicular magnetic anisotropy and the like of the shift-canceling layer 13 can be improved.

The oxide layer 18 is provided on the storage layer 17 so to as to in contact with the storage layer 17, and has a function as a cap layer. The oxide layer 18 contains a predetermined element selected from rare earth elements (such as gadolinium (Gd), scandium (Sc), and yttrium (Y)), silicon (Si) and aluminum (Al). In other words, the oxide layer 18 is formed of an oxide of a rare earth element, a silicon oxide or aluminum oxide.

The molybdenum (Mo) layer 19 is provided on the oxide layer 18 and is in contact with the oxide layer 18. The molybdenum (Mo) layer 19 is formed of molybdenum (Mo) and functions as the top layer.

The upper cap layer 20 is provided on the molybdenum (Mo) layer 19 and is formed of a predetermined conductive material.

The magnetoresistance effect element constituted by the above-described stacked structure 100 is a spin transfer torque (STT) type magnetoresistance effect element having perpendicular magnetization. That is, the magnetization directions of the storage layer 17, the reference layer 15 and the shift-canceling layer 13 are perpendicular respectively to their film surfaces.

When the magnetization direction of the storage layer 17 is parallel to the magnetization direction of the reference layer 15, the magnetoresistance effect element is in a low-resistance state, whereas when the magnetization direction of the storage layer 17 is anti-parallel to the magnetization direction of the reference layer 15, the magnetoresistance effect element is in a high-resistance state. With this mechanism, the magnetoresistance effect element can store binary data according to the resistance state of the magnetoresistance effect element. Further, according to the direction of the current flowing in the magnetoresistance effect element, the magnetoresistance effect element can be set to a low resistance state or a high resistance state.

As described above, in the magnetoresistance effect element of this embodiment, an oxide layer 18 containing a predetermined element selected from a rare earth element, silicon (Si) and aluminum (Al) is provided on the storage layer 17, and the molybdenum (Mo) layer 19 is provided on the oxide layer 18. With this configuration, a magnetoresistance effect element with excellent heat resistance and excellent characteristics can be obtained in this embodiment, which will be described below.

As described above, in this embodiment, the oxide layer 18 containing a predetermined element selected from a rare earth element, silicon (Si) and aluminum (Al) is provided on the storage layer 17. By using the oxide layer 18 containing such an element as a cap layer, it is possible to improve the perpendicular magnetic anisotropy and the like of the storage layer 17. However, when the oxide layer 18 containing such an element is used as the cap layer, the elements contained in the storage layer 17, especially iron (Fe), may diffuse to the outside of the storage layer 17 during heat treatment, which may degrade the characteristics of the storage layer.

In this embodiment, the molybdenum (Mo) layer 19 is provided on the oxide layer 18 used as the cap layer. The molybdenum (Mo) layer 19 can serve to inhibit the diffusion of elements contained in the storage layer 17, thereby making it possible to improve the MR ratio of the storage layer by high-temperature heat treatment.

As described above, according to this embodiment, the perpendicular magnetic anisotropy, etc., of the storage layer 17 can be improved, and also the diffusion of elements (especially, Fe) contained in the storage layer 17 can be suppressed during heat treatment. Therefore, in this embodiment, it is possible to obtain a magnetoresistance effect element with excellent heat resistance and excellent characteristics.

Embodiment 2

Figure 2:
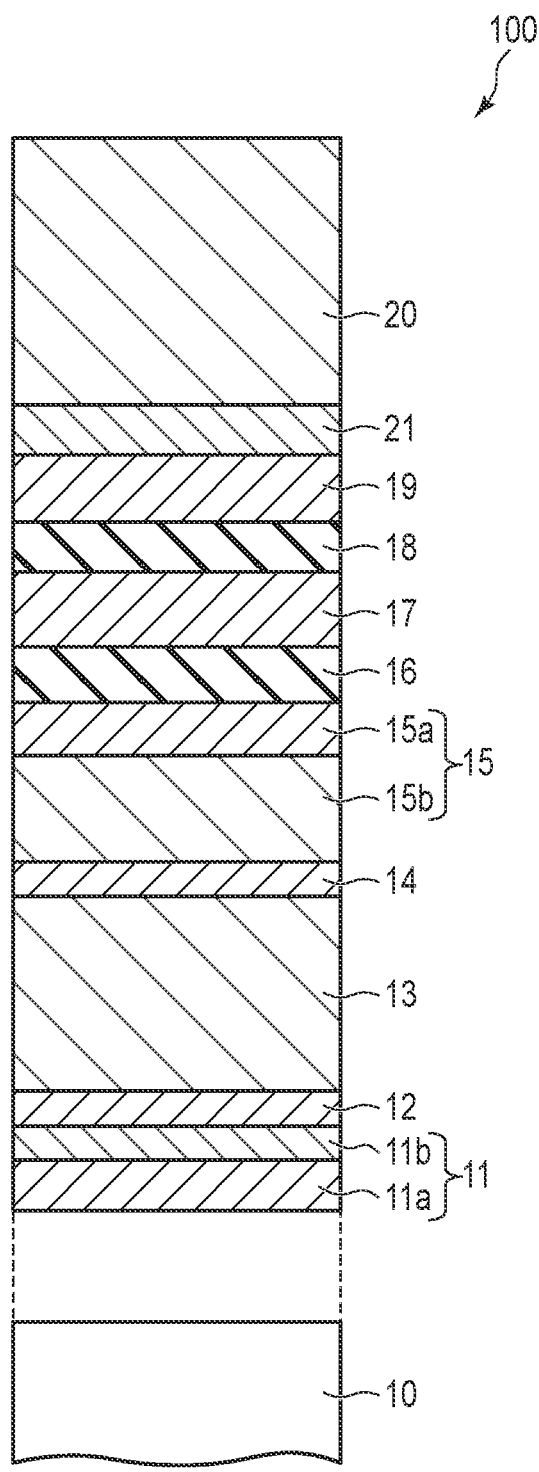
FIG. 2 is a cross-sectional view schematically showing a configuration of a stacked structure of a magnetoresistance effect element contained in a magnetic memory device of the second embodiment.

FIG. 2 is a cross-sectional view schematically showing a configuration of a stacked structure of a magnetoresistance effect element contained in the magnetic memory device of the second embodiment. The basic items are similar to those of the first embodiment, and the description of the items already explained in the first embodiment will be omitted.

In this embodiment, the stacked structure 100 further includes a ruthenium (Ru) layer 21 provided on the molybdenum (Mo) layer 19 and formed of ruthenium (Ru). That is, the stacked structure 100 further includes a ruthenium (Ru) layer 21 provided on the opposite side of the oxide layer 18 with respect to the molybdenum (Mo) layer 19. The rest of the configuration is similar to that of the first embodiment shown in FIG. 1.

In this embodiment as well, the basic configuration of the stacked structure 100 is similar to that of the first embodiment, and advantageous effects similar to those described in the first embodiment can be obtained.

Further, in this embodiment, with the ruthenium (Ru) layer 21 thus provided on the molybdenum (Mo) layer 19, the chemical resistance can be improved. For example, when forming the upper electrode connected to the stacked structure 100 by etching, the layers below the ruthenium (Ru) layer 21 can be protected from the etchant by the ruthenium (Ru) layer 21. Thus, it is possible to suppress the deterioration of the characteristics of the magnetoresistance effect elements constituted by the stacked structure 100.

In this embodiment, the oxide layer 18 is not limited to an oxide layer containing a predetermined element selected from a rare earth element (gadolinium (Gd), scandium (Sc), yttrium (Y) or the like), silicon (Si), and aluminum (Al), but some other oxide layer can as well used.

Application Example

FIG. 3 is a perspective diagram schematically showing a magnetic memory device to which the magnetoresistance effect element shown in the first or second embodiment described above is applied.

The magnetic memory device shown in FIG. 3 comprises a plurality of first wires 210 extending in the X direction, a plurality of second wires 220 extending in the Y direction intersecting the X direction, and a plurality of memory cells 230 connected respectively between the first wires 210 and the second wires 220. For example, the first wires 210 correspond to word lines and the second wires 220 correspond to bit lines, or vice versa.

Each of the memory cells 230 contains a magnetoresistance effect element 240 and a selector (switching element) 250 connected in series to the magnetoresistance effect element 240.

By applying a predetermined voltage between the first wire 210 and the second wire 220 connected to the desired memory cell 230, the selector 250 contained in the desired memory cell 230 is turned on, and thus reading or writing can be carried out with respect to the magnetoresistance effect element 240 contained in the desired memory cell 230.

Note that the magnetic memory device shown in FIG. 7 has a configuration in which the selector 250 is provided on an upper layer side of the magnetoresistance effect element 240, but it may as well be of a configuration in which the selector 250 is provided on a lower layer side of the magnetoresistance effect element 240.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising a stacked structure comprising:
    a first magnetic layer having a fixed magnetization direction;
    a second magnetic layer having a variable magnetization direction;
    a non-magnetic layer provided between the first magnetic layer and the second magnetic layer;
    a molybdenum (Mo) layer provided on an opposite side of the non-magnetic layer with respect to the second magnetic layer;
    an oxide layer provided between the second magnetic layer and the molybdenum (Mo) layer;
    a ruthenium (Ru) layer provided on an opposite side of the oxide layer with respect to the molybdenum (Mo) layer;
    a third magnetic layer provided on an opposite side of the non-magnetic layer with respect to the first magnetic layer, and canceling a magnetic field applied from the first magnetic layer to the second magnetic layer; and
    a layer containing silicon (Si) and boron (B) and provided on an opposite side of the first magnetic layer with respect to the third magnetic layer.

2. The device of claim 1, wherein the second magnetic layer contains iron (Fe).

3. The device of claim 1, wherein the second magnetic layer contains iron (Fe), cobalt (Co) and boron (B).

4. The device of claim 1, wherein the first magnetic layer and the second magnetic layer have perpendicular magnetization.

5. The device of claim 1, wherein the first magnetic layer and the third magnetic layer are antiferromagnetically coupled.

6. The device of claim 1, wherein the stacked structure further comprises a buffer layer provided on an opposite side of the first magnetic layer with respect to the third magnetic layer.

7. The device of claim 6, wherein the layer containing silicon (Si) and boron (B) is provided between the third magnetic layer and the buffer layer.

* * * * *